(12) United States Patent
Son et al.

(10) Patent No.: US 12,560,529 B2
(45) Date of Patent: Feb. 24, 2026

(54) IMAGING ELLIPSOMETER AND METHOD OF MEASURING AN OVERLAY ERROR USING THE SAME

(71) Applicant: Samsung Electronics Co., Ltd., Suwon-si (KR)

(72) Inventors: Jaehyeon Son, Suwon-si (KR); Jinwoo Ahn, Suwon-si (KR); Juntaek Oh, Suwon-si (KR); Hankyoul Moon, Suwon-si (KR); Myungjun Lee, Suwon-si (KR); Eunsoo Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 404 days.

(21) Appl. No.: 18/194,909

(22) Filed: Apr. 3, 2023

(65) Prior Publication Data

US 2023/0408401 A1     Dec. 21, 2023

(30) Foreign Application Priority Data

Jun. 21, 2022     (KR) ........................ 10-2022-0075769

(51) Int. Cl.
| | |
|---|---|
| *G01N 21/21* | (2006.01) |
| *G01N 21/17* | (2006.01) |
| *G03F 7/00* | (2006.01) |

(52) U.S. Cl.
CPC ....... G01N 21/211 (2013.01); G03F 7/70633 (2013.01); G01N 2021/1765 (2013.01)

(58) Field of Classification Search
CPC .. G01B 11/14; G01B 11/24; G01J 4/00; G01J 4/02; G01J 4/04; G01N 21/21; G01N 21/211; G01N 21/23; G01N 2021/212; G01N 2021/213; G01N 2021/214; G01N 2021/215; G01N 2021/216;

(Continued)

(56) References Cited

U.S. PATENT DOCUMENTS

| | | | | |
|---|---|---|---|---|
| 5,581,350 A | * | 12/1996 | Chen .................... | G01N 21/211 |
| | | | | 356/369 |
| 6,798,511 B1 | * | 9/2004 | Zhan .................... | G01N 21/211 |
| | | | | 356/369 |

(Continued)

FOREIGN PATENT DOCUMENTS

| | | | | | |
|---|---|---|---|---|---|
| KR | 20190042536 A | * | 4/2019 | ................ | G01J 4/04 |
| WO | WO-2011148023 A1 | * | 12/2011 | ........... | G01N 21/211 |

*Primary Examiner* — Gordon J Stock, Jr.

(74) *Attorney, Agent, or Firm* — Wolf, Greenfield & Sacks, P.C.

(57) ABSTRACT

In a method of measuring an alignment error, light is incident on a surface of a reference wafer having a known polarization transmittance at the surface. An image signal is obtained from the reference wafer at a set of angles including a first combination of values of a polarizer angle and an analyzer angle. Polarization transmittance of optical equipment including a polarizer and an analyzer is calculated from the image signal of the reference wafer. Light is incident on a surface of a measurement target wafer having a structure on the surface thereof. An image signal is obtained from the measurement wafer at a set of angles including a second combination of values of the polarizer angle and the analyzer angle. At least a portion of Mueller matrix is generated from the image signal of the measurement wafer.

20 Claims, 9 Drawing Sheets

(58) Field of Classification Search
CPC ....... G01N 2021/217; G01N 2021/218; G01N 2021/1765; G03F 7/70633; G03F 7/706843; G03F 7/706845; G03F 7/706849; G03F 7/706851; G03F 7/70681; G03F 7/70653
See application file for complete search history.

(56) References Cited

U.S. PATENT DOCUMENTS

| | | | |
|---|---|---|---|
| 7,277,172 B2 | 10/2007 | Kandel et al. | |
| 7,477,387 B2 * | 1/2009 | Saitoh .................... | G01N 21/21 |
| | | | 356/73.1 |
| 7,663,752 B2 * | 2/2010 | Otsuki ................ | G01N 21/211 |
| | | | 250/225 |
| 7,859,661 B2 | 12/2010 | Ossikovski et al. | |
| 8,125,641 B2 * | 2/2012 | Li ........................ | G01N 21/211 |
| | | | 356/369 |
| 8,427,645 B2 * | 4/2013 | Vagos .................... | G01N 21/23 |
| | | | 356/369 |
| 8,525,993 B2 | 9/2013 | Rabello et al. | |
| 8,724,109 B2 * | 5/2014 | Setija ................. | G03F 7/70633 |
| | | | 356/399 |
| 8,830,463 B2 * | 9/2014 | Cho ..................... | G01N 21/211 |
| | | | 356/369 |
| 8,908,180 B2 * | 12/2014 | Acher ...................... | G01J 4/04 |
| | | | 356/369 |
| 9,007,584 B2 | 4/2015 | Li | |
| 9,046,474 B2 | 6/2015 | Kwak et al. | |
| 9,404,872 B1 * | 8/2016 | Wang ................. | G01N 21/274 |
| 9,459,152 B1 * | 10/2016 | Ellis .......................... | G01J 1/08 |
| 9,952,140 B2 * | 4/2018 | Wang ................. | G03F 7/70625 |
| 10,296,554 B2 | 5/2019 | Vagos et al. | |
| 10,317,334 B2 | 6/2019 | Cho et al. | |
| 10,345,568 B2 * | 7/2019 | Chen .................. | G02B 21/0092 |
| 10,732,515 B2 | 8/2020 | Atkins et al. | |
| 11,262,293 B2 * | 3/2022 | Rapaport ............. | G01N 21/274 |
| 11,493,433 B2 * | 11/2022 | Cho .................... | G01B 11/272 |
| 11,619,883 B2 * | 4/2023 | Chen .................... | G03F 7/7085 |
| | | | 356/138 |
| 11,972,960 B2 * | 4/2024 | Lee .................... | H01L 21/67242 |
| 12,386,271 B2 * | 8/2025 | Smith .................... | G01B 11/27 |
| 2023/0204422 A1 * | 6/2023 | Ahn ........................ | G01J 3/447 |
| | | | 356/369 |
| 2023/0305282 A1 * | 9/2023 | Ozawa ............... | G02B 21/0092 |
| 2023/0400404 A1 * | 12/2023 | Choi ...................... | G01N 21/21 |
| 2024/0159656 A1 * | 5/2024 | Teh ...................... | G01N 21/211 |
| 2024/0295490 A1 * | 9/2024 | Kim .................... | G01N 21/956 |

* cited by examiner

L[i,j]

α[i]β[j]

K[i,j]

Q[i,j]

K[i,j]

H_α [i] H_β [j]

IMAGING ELLIPSOMETER AND METHOD OF MEASURING AN OVERLAY ERROR USING THE SAME

PRIORITY STATEMENT

This application claims priority under 35 U.S.C. § 119 to Korean Patent Application No. 10-2022-0075769, filed on Jun. 21, 2022 in the Korean Intellectual Property Office (KIPO), the contents of which are herein incorporated by reference in their entirety.

BACKGROUND

1. Field

Example embodiments relate to an imaging ellipsometer and a method of measuring an alignment error using the same. More particularly, example embodiments relate to an imaging ellipsometer capable of obtaining a large-area image using an elliptic polarization analysis technology and a method of measuring an alignment error using the same.

2. Description of the Related Art

Spectroscopic ellipsometry analysis technology is a technology that irradiates polarized light onto a sample and measures a change in a polarization state of reflected light. An asymmetry, such as an alignment error (overlay error) in a semiconductor process, may be measured using a spectrum obtained through such a spectroscopic ellipsometry analysis technology. However, in an existing measurement of overlay error, since an overlay key formed in a scribe lane region outside a die region of a semiconductor chip is measured, there is a problem in that the overlay error in actual cells in the die region may not be accurately represented. Further, when many areas are measured using a large-area measurement method to shorten a measurement time, a brightness value detected in each pixel includes noise sensitive to the polarization distortion effect of an optical system except for a wafer itself, thereby causing inaccuracies in the alignment error measurement.

SUMMARY

Example embodiments provide an a method for measuring alignment error that can accurately measure asymmetry of structures formed on a semiconductor wafer using elliptically polarized light technology.

Example embodiments provide an imaging ellipsometer for performing the above-described alignment error measurement method.

According to example embodiments, in a method of measuring an alignment error, light is incident on a surface of a reference wafer having a known transmittance at the surface. An image signal is obtained from the reference wafer at a set of angles including a first combination of values of a polarizer angle and an analyzer angle. Polarization transmittance of optical equipment including a polarizer and an analyzer is calculated from the image signal of the reference wafer. Light is incident on a surface of a measurement target wafer having a structure to be measured on the surface thereof. An image signal is obtained from the measurement wafer at set of angles including a second combination of values of the polarizer angle and the analyzer angle. At least a portion of a Mueller matrix is generated from the image signal of the measurement wafer.

According to example embodiments, in a method of measuring an alignment error, a polarizer is on an optical path of incident light to be incident on a sample surface, the polarizer being rotatable by a first angle to adjust a polarization direction of the incident light. An analyzer is on an optical path of light reflected from the sample surface, the analyzer being rotatable by a second angle to adjust a polarization direction of the reflected light. A reference wafer having a known polarization transmittance at a surface thereof provided as a sample. An image signal is obtained from the reference wafer at a set of angles including a first combination of the first angle of the polarizer and the second angle of the analyzer. Polarization transmittance of optical equipment including the polarizer and the analyzer is calculated from the image signal of the reference wafer. A measurement target wafer on which a structure to be measured is formed is provided as the sample. An image signal is obtained from the measurement target wafer at a set of angles including a second combination of the first angle of the polarizer and the second angle of the analyzer. At least a portion of a Mueller matrix is generated from the image signal of the measurement target wafer.

According to example embodiments, an imaging ellipsometer includes a light source configured to irradiate incident light on a sample surface, a polarizer on an optical path of the incident light on the sample surface, the polarizer being rotatable by a first angle to adjust a polarization direction of the incident light, an analyzer on an optical path of light reflected from the sample surface, the analyzer being rotatable by a second angle to adjust a polarization direction of the reflected light, a light detector configured to receive the light passing through the analyzer to collect image data, a controller configured to control operations of the polarizer and the analyzer to obtain an image signal from the sample at a combination of rotations by the first angle of the polarizer and the second angle of the analyzer, and a processor configured to generate at least a portion of a Mueller matrix from the images obtained by the light detector, the processor configured to analyze elements of the at least a portion of the Mueller matrix to evaluate asymmetry including an overlay error.

According to example embodiments, an imaging ellipsometer may include a light irradiator configured to irradiate light having a polarization component to multiple points (a measurement area of a certain area) on a sample surface and an imaging assembly configured to receive light reflected from the wafer and detect an image according to a polarization state at each of the multiple points.

The light irradiator may include a monochromator configured to separate short wavelength band from broadband wavelength band and a polarizer configured to polarize the light incident on the measurement area, and the imaging assembly may include an analyzer configured to polarize the reflected light, an imaging mirror optical system on an optical path of the reflected light that passes through the analyzer, and a two-dimensional image sensor as the light detector configured to receive the light passing through the imaging mirror optical system to collect data.

In addition, the image ellipsometer may include a processor configured to generate at least a portion of a Mueller matrix from the 2D images obtained by the light detector and analyze elements of the at least a portion of the Mueller matrix to evaluate asymmetry such as an overlay error.

Thus, the imaging ellipsometer may use a specific angle combination of two polarizing filters (e.g., of the analyzer and the polarizer) to more accurately measure the alignment error by removing the influence of polarization distortion due to optical equipment such as an optical system except for the sample to be measured.

BRIEF DESCRIPTION OF THE DRAWINGS

Example embodiments will be more clearly understood from the following detailed description taken in conjunction with the accompanying drawings. FIGS. 1 to 11 represent non-limiting, example embodiments as described herein.

FIG. 1 is a schematic diagram illustrating an imaging ellipsometer in accordance with example embodiments.

FIG. 2 is a perspective view of a light incident on a sample surface and a light reflected therefrom in accordance with example embodiments.

FIG. 3 is a plan view illustrating a spot of an incident light irradiated by the imaging ellipsometer of FIG. 1.

FIG. 4 is a view illustrating pixels of a detector of the imaging ellipsometer of FIG. 1.

FIG. 5 is a cross-sectional view illustrating an overlay error between an upper structure and a lower structure formed on a wafer surface that is measured by the imaging ellipsometer in FIG. 1.

FIG. 6 is a view illustrating a set of angles including a combination of a polarizer angle and an analyzer angle of the imaging ellipsometer in FIG. 1.

FIG. 7 is a view illustrating spectral images for wavelengths detected by the detector of the imaging ellipsometer in FIG. 1.

FIG. 8 is a view illustrating a light intensity spectrum for wavelengths in one pixel in FIG. 7.

FIG. 11 is a flow chart illustrating a method of measuring an alignment error in accordance with example embodiments.

DETAILED DESCRIPTION OF EXAMPLE EMBODIMENTS

Hereinafter, example embodiments will be explained in detail with reference to the accompanying drawings.

Figure 1:
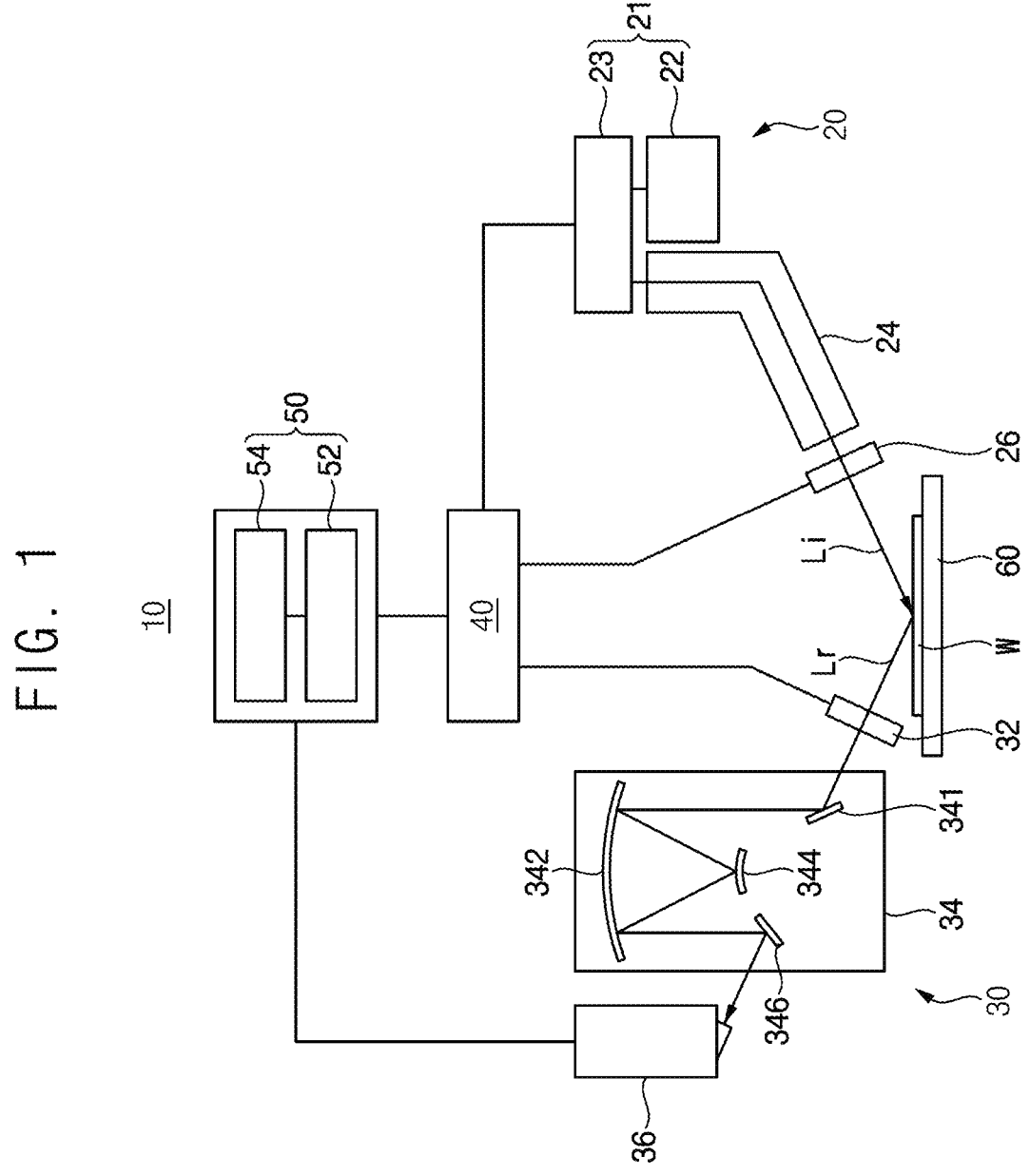
Figure 2:
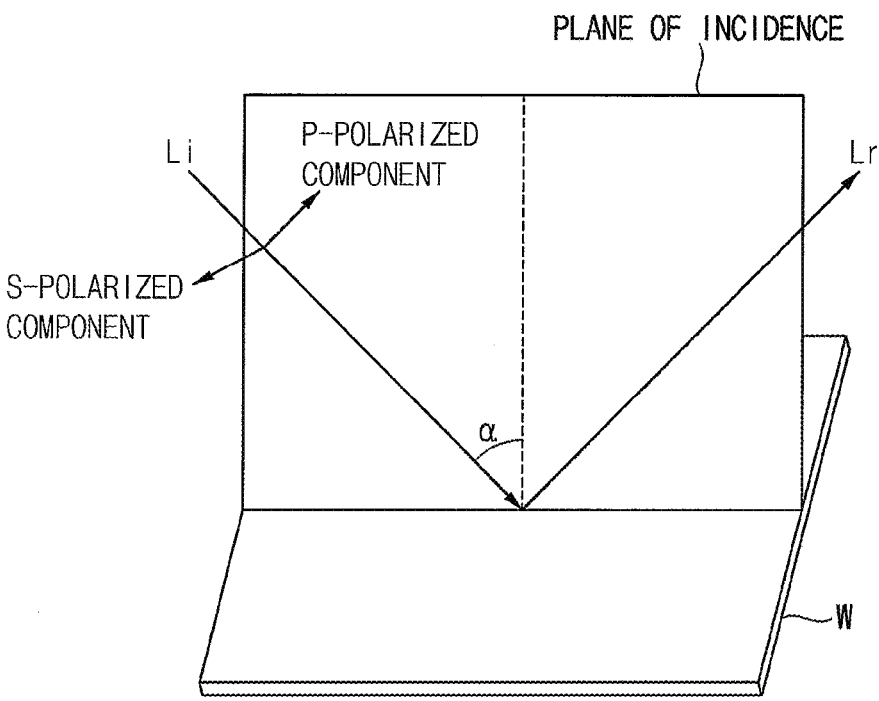
Figure 3:
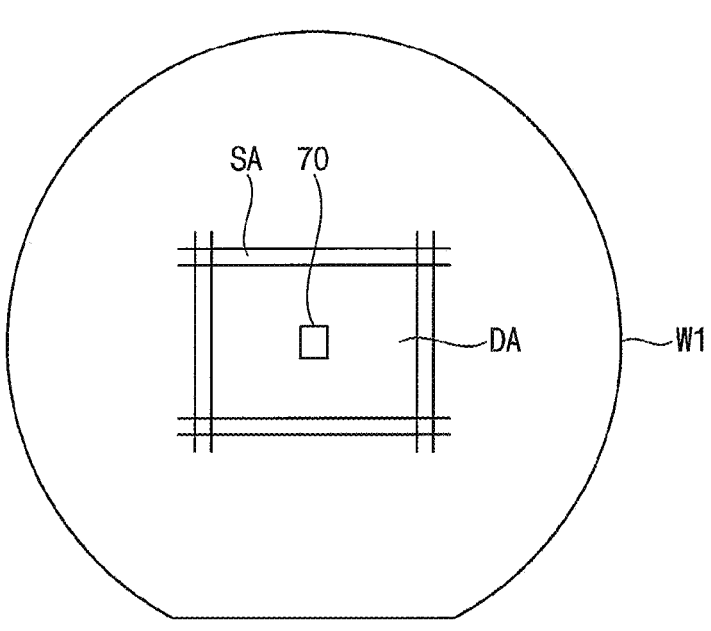
Figure 4:
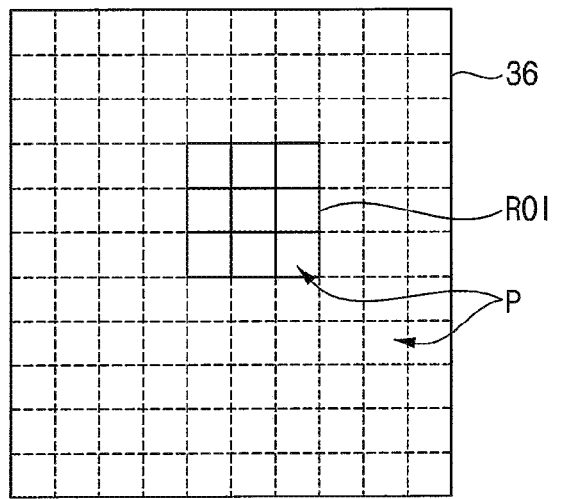
Figure 5:
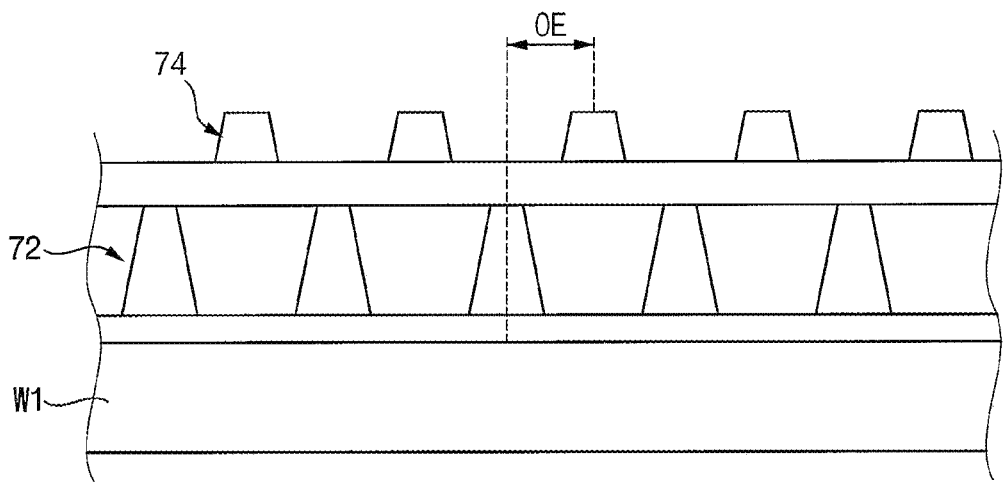
Figure 6:
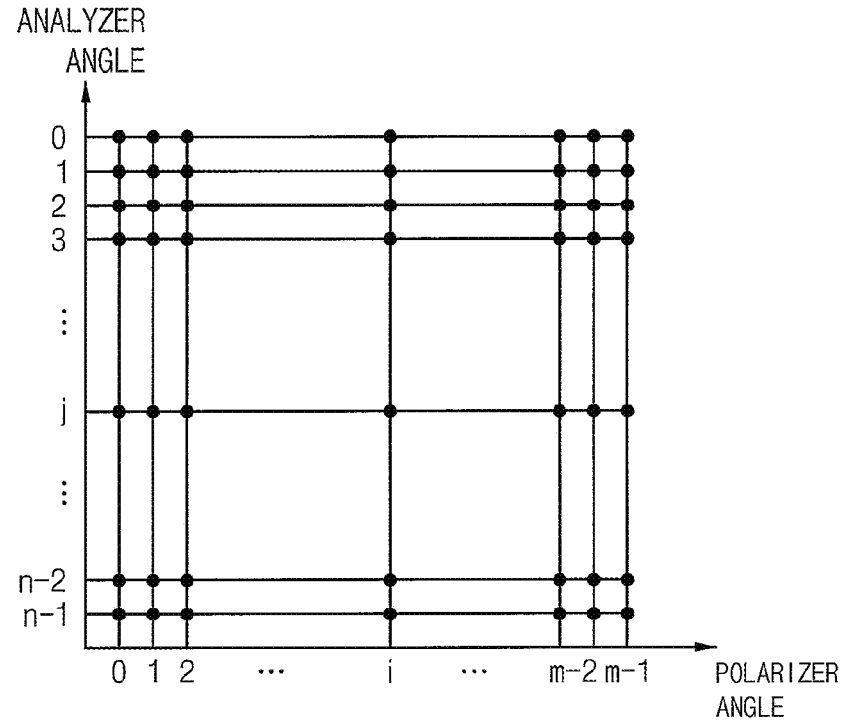
Figure 7:
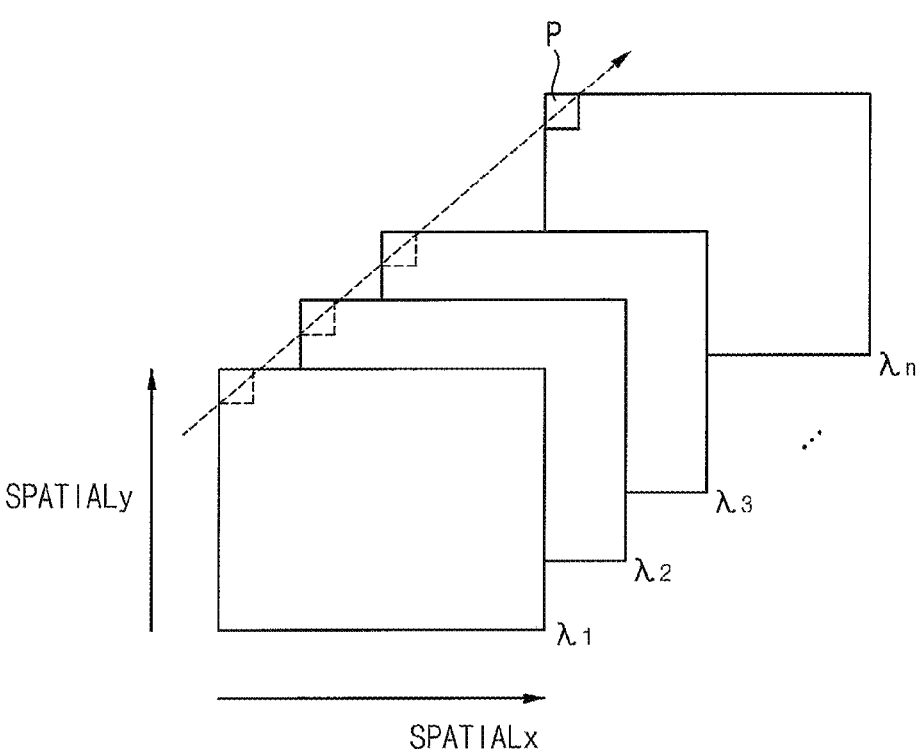
Figure 8:
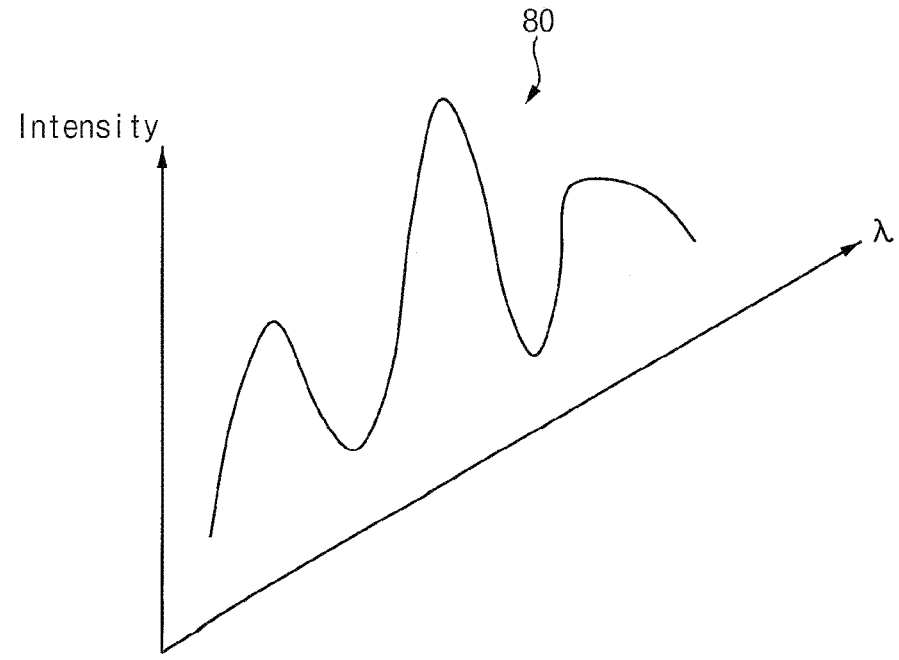

FIG. 1 is a schematic diagram illustrating an imaging ellipsometer in accordance with example embodiments. FIG. 2 is a perspective view illustrating a light incident on a sample surface and a light reflected therefrom. FIG. 3 is a plan view illustrating a spot of an incident light irradiated by the imaging ellipsometer of FIG. 1. FIG. 4 is a view illustrating pixels of a detector of the imaging ellipsometer of FIG. 1. FIG. 5 is a cross-sectional view illustrating an overlay error between an upper structure and a lower structure formed on a wafer surface that is measured by the imaging ellipsometer in FIG. 1. FIG. 6 is a view illustrating a set of angles including combinations of a polarizer angle and an analyzer angle of the imaging ellipsometer in FIG. 1. FIG. 7 is a view illustrating spectral images for wavelengths detected by the detector of the imaging ellipsometer in FIG. 1. FIG. 8 is a view illustrating a light intensity spectrum for wavelengths in one pixel in FIG. 7.

Referring to FIGS. 1 to 8, an imaging ellipsometer 10 may include a light irradiator 20 configured to irradiate a polarized incident light Li whose direction changes on a sample surface such as a wafer W and a detector 30 configured to receive a reflected light Lr that is reflected from the wafer W and to detect an image according to a polarization state at each of a plurality of points on the sample surface. In addition, the imaging ellipsometer 10 may further include a controller 40 configured to control operations of the light irradiator 20 and the detector 30, a processor 50 configured to process data of the detected image, and a stage 60 configured to support the wafer W. The controller 40 may be a hardware device or a software program that is configured to control operations of the light irradiator 20 and the detector 30. For example, the controller 40 may be configured to manage or direct the flow of data among the processor 50 and the components of the light irradiator 20 and the detector 30. In addition, the controller 40 may be configured to send commands (e.g., position adjustment commands) and receive data (e.g., positioning data) to and from components of the light irradiator 20 and the light detector 30.

In example embodiments, the imaging ellipsometer 10 may be an imaging elliptic spectroscopy apparatus of a surface measurement type that measures multiple points instead of one point on the wafer surface. In addition, the imaging ellipsometer 10 may irradiate the surface of the wafer W with light of a broadband wavelength in order to obtain desired information on a miniaturized semiconductor structure, thickness, physical properties, overlay error, etc. For this imaging elliptic spectroscopy apparatus, the light irradiator 20 may include a monochromator 23 configured to select and transmit a narrow wavelength band from a wide wavelength band, and the light detector 30 may include a camera, such as a two-dimensional image sensor.

The wafer W may be a semiconductor substrate. For example, the semiconductor substrate may include or may be formed of silicon, strained silicon (strained Si), silicon alloy, silicon carbide (SiC), silicon germanium (SiGe), silicon germanium carbide (SiGeC), germanium, germanium alloy, gallium arsenide (GaAs), indium arsenide (InAs) and III-V semiconductors, II-VI semiconductors and a combination thereof. In addition, if necessary, the wafer may be an organic plastic substrate rather than the semiconductor substrate.

The wafer W may be supported on the stage 60. The stage 60 may move the wafer W to a specific position during a measurement process. For example, the stage 60 may move the wafer W in a first direction or a second direction perpendicular to the first direction.

As illustrated in FIGS. 1 and 2, the light irradiator 20 may irradiate the polarized light whose direction changes, that is, the incident light Li, toward the surface of the wafer W. The light irradiator 20 may generate the polarized light, that is, incident light Li, at a predetermined angle α with respect to the surface of the wafer W. When the incident light Li is obliquely incident on the sample surface, the plane of incidence of light may be defined by an incidence path and a reflection path of the light. The oscillation direction of the electric field may be perpendicular to the propagation direction of light. Here, an electric field component parallel to the plane of incidence may be referred to as p-wave, and an electric field component perpendicular to the plane of incidence may be referred to as s-wave. When the p-wave and the s-wave are incident on the sample and then are reflected therefrom, the amplitude and the phase may change independently each other.

In particular, the light irradiator 20 may include a light source assembly 21 and an illumination assembly 24 (FIG. 1). The light source assembly 21 may include a light source 22 and a monochromator 23, and the illumination assembly 24 may include an illumination optical system and a polarizer 26 as a polarization state generator (PSG).

The light source 22 may generate broadband light. For example, the light source 22 may include a broadband light source such as a laser plasma light source. The wavelength band of the light generated by the light source 22 may vary depending on the object to be measured, and may generally have a bandwidth ranging from Ultraviolet (UV) band to Near Infrared (NIR) band. The monochromator 23 may extract light of a specific wavelength from the light generated from the light source 22. For example, the monochromator 23 may extract monochromatic light from broadband light and illuminate the monochromatic light through the illumination assembly 24.

The light emitted from the light source assembly 21 may travel along a path of the incident light Li in the illumination assembly 24. The light emitted from the light source assembly 21 into the illumination assembly 24 may be converted into parallel light by a collimator lens of the illumination optical system. An illumination body of the illumination assembly 24 may extend in the same direction as the path of the incident light Li, and the polarizer 26 may be fixedly installed in the illumination body. The incident light Li may be irradiated to a measurement area 70 (FIG. 3) of the wafer W placed on the stage 60 through the polarizer 26.

The polarizer 26 may adjust a polarization direction of the incident light Li (FIG. 1). The polarizer 26 may include a rotating part that can adjust the polarization direction, and may rotate by a first angle. The first angle of the polarizer 26 may be maintained to have a constant value, and the polarizer 26 may be repeatedly rotated by the first angle. Thus, a set of angles may be obtained by rotating the polarizer 26 by the first angle for each polarizer angle in the set of angles. Alternatively, the polarizer 26 may be electrically connected to the controller 40, and the controller 40 may adjust the first angle of the polarizer 26. The polarizer 26 may include a hollow type motor for adjusting the first angle. The polarizer 26 may be a polarizing filter including a wire grid provided on a rotation shaft of the hollow motor.

Accordingly, the incident light Li as monochromatic light extracted from the light generated from the light source 22 may be irradiated to the measurement area 70 on the wafer W, and the reflected light Lr reflected from the wafer W may be collected into an imaging assembly of the detector 30.

The detector 30 may receive the light Lr reflected from the wafer W and detect a two-dimensional image of the sample surface 70 (FIG. 3) according to a change in polarization. The detector 30 may include an analyzer 32 such as a polarization state analyzer (PSA) provided in the imaging assembly 34, an imaging mirror optical system 34 and a light detector 36. The analyzer 32, the imaging mirror optical system 34 and the light detector 36 may be fixedly installed in an emitting body of the imaging assembly.

The analyzer 32 may adjust a polarization direction of the reflected light Lr reflected from the wafer W. The analyzer 32 may include a rotating part, and may rotate by a second angle. The analyzer 32 may be repeatedly rotated by the second angle. Thus, a set of angles may be obtained by rotating the analyzer 32 by the second angle for each analyzer angle in the set of angles. The analyzer 32 may be electrically connected to the controller 40. The controller may adjust the second angle of the analyzer 32. The analyzer 32 may transmit only a linearly polarized light component corresponding to the second angle. The rotating part of the analyzer 32 may include a hollow type motor for adjusting the second angle. The analyzer 32 may be a polarizing filter including a wire grid provided on a rotation shaft of the hollow motor.

The imaging mirror optical system 34 may image the reflected light Lr passing through the analyzer 32 on a light receiving plane of the light detector 36. The imaging mirror optical system 34 may have an object plane and an imaging plane as conjugate planes. The object plane of the imaging mirror optical system 34 may be positioned on the surface of the wafer W, and the imaging plane of the imaging mirror optical system 34 may be positioned on the light receiving plane of the light detector 36.

The imaging mirror optical system 34 may have a relatively long working distance WD. The analyzer 32 may be positioned between the object plane and the imaging mirror optical system 34. In this case, in consideration of a size of the hollow type motor, the imaging mirror optical system 34 may be designed to have a relatively long working distance.

In example embodiments, the imaging mirror optical system 34 may be a mirror-based imaging optical system including at least two mirrors. In the case of an existing lens-based optical system, since a large number of lenses (e.g., 8 to 16) are used to satisfy optical performance of a broadband wavelength, transmittance may be reduced, and chromatic aberration may occur. However, when the mirror-based imaging optical system is used, it may be possible to minimize chromatic aberration and secure transmittance in a specific wavelength region.

In particular, the imaging mirror optical system 34 may include a first mirror 342 having a concave surface, a second mirror 344 having a convex surface, and a third mirror 346. The first mirror 342 may be a concave spherical mirror, and the second mirror 344 may be a convex spherical mirror. The first mirror 342 and the second mirror 344 may be arranged to produce at least three reflections within the optics. The first mirror 342 and the second mirror 344 may form concentric circles. The centers of the radii of curvature of the first mirror 342 and the second mirror 344 may coincide with one point. The radius of the first mirror 342 may be twice the radius of the second mirror 344. A magnification of the imaging mirror optical system 34 including the first and second mirrors 342 and 344 may be one.

The object plane may be positioned at a first conjugation point, and the imaging plane may be positioned at a second conjugation point. That is, the reflected light Lr from the first conjugate point may be incident and primarily reflected to the first mirror 342 of the imaging mirror optical system 34, and the primarily reflected light may be secondarily reflected by the second mirror 344 and proceed toward the first mirror again, and then, may be thirdly reflected by the first mirror 342 and travel toward the second conjugate position.

The reflected light Lr reflected from the wafer surface 70 (FIG. 3) may pass through the analyzer 32, and the reflected light Lr that has passed through the analyzer 32 may impinge on a first portion of the first mirror 342 (FIG. 1). The reflected light Lr passing through the analyzer 32 may be incident off-axis on the first portion of the first mirror 342. The first portion of the first mirror 342 may firstly reflect the reflected light to be directed toward the second mirror 344.

The second mirror 344 may secondarily reflect the reflected light to be directed toward a second portion of the first mirror 342. The second portion of the first mirror 342 may thirdly reflect the reflected light, and the thirdly reflected light from the second portion of the first mirror 342 may be focused on the light receiving plane of the light detector 36 through the third mirror 346 which is a plane mirror.

The third mirror 346 may deflect the light reflected from the second portion of the first mirror 342 toward the light detector 36. The third mirror 346 may redirect the light reflected from the second portion of the first mirror 342 in order to change a position of the light detector 36.

In addition, the image mirror optical system 34 may further include a fourth mirror 341 configured to redirect the reflected light passing through the analyzer 32. The fourth mirror 341 may be a plane mirror. The fourth mirror 341 may be configured to deflect the reflected light Lr passing through the analyzer 32 toward the first mirror 342 in order to change positions of the first to third mirrors 342, 344 and 346. Although it is not illustrated in the drawings, the image mirror optical system 34 may further include a compensation lens configured to compensate for chromatic aberration.

The light detector 36 may detect a spectral image from the reflected light Lr passing through the imaging mirror optical system 34. For example, the light detector 36 may detect a spectral image for a particular wavelength. The light detector 36 may include a camera as a two-dimensional image sensor capable of detecting the reflected light Lr.

As illustrated in FIGS. 3 and 4, when the incident light Li is incident at a predetermined angle α with respect to the surface of the measurement target wafer W1, the incident light Li incident on the measurement area 70 may have a measurable spot size of a predetermined area. For example, the measurable spot size may have an area of at least 20 mm×20 mm. The light detector 36 may be a sensor, including a 2D camera, that detects the reflected light Lr reflected from the large-area measurement area 70 and separate it into several pixels P to analyze the reflected light.

The measurement target wafer W1 may include a die (chip) region DA in which circuit patterns and cells are formed and a scribe lane region SA surrounding the die region DA. The measurement area 70 to which the incident light Li is incident may be in the die region DA of the measurement target wafer W1. Accordingly, it may be possible to measure an overlay in a cell region (On-Cell Overlay) of an actual chip.

A region of interest (ROI) may be set in a pixel array 36 of the camera. Several pixels may be gathered to form one region of interest (ROI). The number of pixels in one region of interest (ROI) may be determined in consideration of the size of a unit device in the cell region. As will be described later, one overlay error value may be calculated from one ROI. For example, thousands to tens of thousands of ROIs may be set in one image.

As illustrated in FIG. 5, the measurement target wafer W1 may include a lower pattern 72 and an upper pattern 74 vertically stacked on the lower pattern 72 in the region of interest ROI (FIG. 4). The image ellipsometer 10 may perform an asymmetric measurement. An example of the asymmetry may be an alignment error or an overlay error OE between the lower pattern 72 and the upper pattern 74. Each of the lower pattern 72 and the upper pattern 74 may include a grid shape extending in one direction, an isolated shape of a dot shape, etc. At least one of the lower pattern 72 and the upper pattern 74 may have a through-hole shape with high aspect ratio.

The controller 40 may be connected to the monochromator 23, the polarizer 26, the analyzer 32, the light detector 36 and the processor 50 to control operations thereof. The controller 40 may receive a set of angles including a combination of values of the polarizer angle and the analyzer angle from the processor 50. The set of angles may include the combination of the first angle of the polarizer 26 and the second angle of the analyzer 32. The controller 40 may control the polarizer 26 and the analyzer 32 according to the inputted angle(s) or a set of angles to change the first and second angles. For example, the controller 40 may rotate the polarizer 26 and/or the analyzer 32 by an input angle.

The polarizer 26 may rotate by an integer multiple (i) of a first unit angle ($\theta_{unit}$), and the analyzer 32 may rotate by an integer multiple (j) of a second unit angle ($\theta_{unit}$) to produce a set of angles according to a particular combination. The first angle (OUP of the polarizer 26 may be a value ($i\theta_{unit}$) obtained by multiplying the first unit angle by the integer multiple (i), and the second angle ($\phi[j]$) of the analyzer 32 may be a value ($j\theta_{unit}$) obtained by multiplying the second unit angle by the integer multiple (j). The first and second unit angles may be an angle obtained by dividing 360 degrees by an integer of 8 or more. For example, an angle of 10° obtained by dividing 360° by 36 may be the unit angle.

As illustrated in FIG. 6, when the rotation index i of the polarizer 26 is 0, 1, . . . , m−1, and the rotation index j of the analyzer 32 is 0, 1, . . . , n−1, the number of combinations of the first angle and the second angle may be m×n (m and n are natural numbers). In this case, sample analysis may be performed by obtaining m×n images for each wavelength. The polarizer angle $\theta_{PSG}[i]$ can be expressed by following Equation (1).

$$\theta_{PSG}[i] = Z_{PSG} + S_{PSG}\phi[i] + \Delta_{PSG} \qquad \text{Equation (1)}$$

Here, $Z_{PSG}$ is an initial rotation angle value of the polarizer, $S_{PSG}$ is a rotation direction (1) of the polarizer motor, and $\Delta_{PSG}$ is an angle error value of the polarizer.

The analyzer angle $\theta_{PSA}[i]$ can be expressed by the following equation (2).

$$\theta_{PSA}[i] = Z_{PSA} + S_{PSA}\phi[i] + \Delta_{PSA} \qquad \text{Equation (2)}$$

Here, $Z_{PSG}$ and $Z_{PSA}$ are initial rotation angle values of the polarizer and the analyzer, $S_{PSA}$ is a rotation direction (−1) of the analyzer motor, and $\Delta_{PSA}$ is an analyzer angle error value.

The controller 40 may generate a set of angles by changing the first and second angles according to a preset value. For example, the set of angles may be generated by maintaining the first angle of polarizer 26 at a constant value and varying the second angle of analyzer 32 or maintaining the second angle of analyzer 32 at a constant value and varying the first angle of the polarizer 26.

The processor 50 may receive spectral images (see FIG. 7) from the light detector 36. For example, the processor 50 may receive first spectral images (illustrated as one image in the drawing) corresponding to the set of angles and a first wavelength λ1 and second spectral images (illustrated as one image in the drawing) corresponding to the set of angles and a second wavelength λ2 different from the first wavelength, from the light detector 36. Similarly, the processor 50 may receive spectral images corresponding to different wavelengths (λ3, . . . , λn). The processor 50 may generate a spectral matrix by using the spectral images. In addition, the processor 50 may generate a spectrum 80 (see FIG. 8) representing a change in light intensity for wavelengths in each pixel by using the spectral matrix.

As illustrated in FIG. 7, respective spectral images may be obtained for each set of angles by the light detector 36. The spectral image may be composed of data for a spatial coordinate x (SPATIAL x) and a spatial coordinate y (SPATIAL y). A set of angles may be selected for each wavelength, and spectral images corresponding to the wavelength and the set of angles may be obtained, respectively.

The spectral matrix may be formed from the spectral images obtained by the light detector 36. The spectral matrix may represent a virtual spectral data structure obtained through a pixel resampling process of a spatial area and a spectral area. The spectral matrix may be referred to as a spectral cube. The spectral matrix may be composed of spatial coordinates (Spatial Axes), that is, SPATIAL X and SPATIAL Y, and may be composed of a plurality of spectral images according to a wavelength λ in a width direction. That is, the spectral matrix may be composed of data in the form of a spectral cube having spatial coordinates X and Y of the pixel array of the measurement sample, and a wavelength λ as coordinate axes.

The spectral matrix may include the spectral images with spatial coordinates of each pixel P captured by a Field Of View (FOV) of a light sensor included in the light detector 36, and a spectrum of each pixel P according to a wavelength. That is, the spectral matrix may include a plurality of spectral images and a spectrum representing a change in the light intensity according to wavelength in each pixel P of the spectral images.

As illustrated in FIG. 8, as indicated by arrows from the spectral images, a light quantity spectrum 80 for wavelengths may be obtained from a pixel P at the same position. The spectrum 80 may represent a change in intensity according to the wavelength of the reflected light Lr at a specific position (pixel).

Hereinafter, an alignment error analysis method performed by the processor will be described in detail.

In example embodiments, the processor 50 may generate at least a portion of a Mueller matrix from images obtained by the light detector 36, and may analyze elements of the at least a portion of the Mueller matrix to evaluate asymmetry such as an overlay error. The processor 50 may express light intensity of light reaching each pixel of the two-dimensional image sensor as a product of transmittance component for polarization of optical equipment, i.e., optical elements including the polarizer 26 and the analyzer 32 (optics factor) and transmittance component for polarization of a sample surface (kernel) through a light brightness model defined for each wavelength and each pixel of the optical equipment (optical elements), may calculate the transmittance component for polarization of the optical equipment using light intensity for each pixel of an image obtained from a reference sample Wr whose transmittance component for polarization is known in advance, and may generate and analyze at least a portion of a Mueller matrix of a measurement target wafer W1 using light intensity for each pixel of an image obtained from the measurement target wafer W1 and the calculated transmittance component for polarization of the optical equipment to measure an alignment error of the measurement target wafer W1.

The processor 50 may include a first processor 52 and a second processor 54. The first processor 52 may calculate the transmittance component for polarization of the optical equipment using the light intensity for each pixel of the image obtained from the reference sample Wr at a set of angles including a first combination C1 of values of the first angle of the polarizer 26 and the second angle of the analyzer 32. The second processor 54 may generate and analyze at least a portion of a Mueller matrix of the measurement target wafer W1 using the light intensity for each pixel of the image obtained from the measurement target wafer W1 at a set of angles including a second combination C2 of values of the first angle of the polarizer 26 and the second angle of the analyzer 32 and the transmittance component of the optical equipment calculated by the first processor 52, to measure the alignment error of the measurement target wafer W1.

The Mueller matrix can be expressed as a 4×4 matrix for interaction with incident light. Since the imaging ellipsometer 10 uses two polarizing filters, namely, the polarizer 26 and the analyzer 32, interaction with a sample related to circular polarization may not occur. Accordingly, the optical elements of the imaging ellipsometer 10 may be expressed as 3×3 Mueller matrix.

Assuming that the polarizer 26 and the analyzer 32 are ideal polarizing filters, the Mueller matrix P(θ) according to transmission direction angle θ of the ideal polarizing filters can be expressed by the following equation (3).

$$
\begin{aligned}
P(\theta) &= \frac{1}{2}\begin{bmatrix} 1 & 0 & 0 \\ 0 & \cos 2\theta & -\sin 2\theta \\ 0 & \sin 2\theta & \cos 2\theta \end{bmatrix}\begin{bmatrix} 1 & 1 & 0 \\ 1 & 1 & 0 \\ 0 & 0 & 0 \end{bmatrix}\begin{bmatrix} 1 & 0 & 0 \\ 0 & \cos 2\theta & \sin 2\theta \\ 0 & -\sin 2\theta & \cos 2\theta \end{bmatrix} \\
&= \frac{1}{2}\begin{bmatrix} 1 & \cos 2\theta & \sin 2\theta \\ \cos 2\theta & \cos^2 2\theta & \cos 2\theta \sin 2\theta \\ \sin 2\theta & \cos 2\theta \sin 2\theta & \sin^2 2\theta \end{bmatrix} \\
&= \frac{1}{2}\begin{bmatrix} 1 \\ \cos 2\theta \\ \sin 2\theta \end{bmatrix}\begin{bmatrix} 1 & \cos 2\theta & \sin 2\theta \end{bmatrix} \\
&= \frac{1}{2}\vec{p}(\theta)\vec{p}^{T}(\theta)
\end{aligned}
\qquad \text{Equation (3)}
$$

Here, $\vec{p}(\theta)$ is a polarization basis vector, and may be defined as Equation (4) below.

$$\vec{p}(0) = [1 \ \cos 2\theta \ \sin 2\theta]^{T} \qquad \text{Equation (4)}$$

However, the actual polarizer 26 and the actual analyzer 32 may have different physical properties (physical transmittance), such as thicknesses, depending on the location for reasons such as a manufacturing process. In order to correct this physical transmittance, Mueller matrix $M_{PSG}[i]$ according to the transmission direction angle θ of the polarizer 26 and Mueller matrix $M_{PSA}[j]$ according to the transmission direction angle θ of the analyzer 32 may include respective transmittance coefficients, and can be expressed by the following equations (5) and (6).

$$M_{PSG}[i] = \tau_{PSG}[i]\vec{p}(\theta_{PSG}[i])\vec{p}^{T}(\theta_{PSG}[i]) \qquad \text{Equation (5)}$$

Here, $\tau_{PSG}[i]$ is the polarizer transmittance coefficient.

$$M_{PSA}[j] = \tau_{PSA}[j]\vec{p}(\theta_{PSA}[j])\vec{p}^{T}(\theta_{PSA}[j]) \qquad \text{Equation (6)}$$

Here, $\tau_{PSA}[j]$ is the analyzer transmittance coefficient.

When the light from the light source passes through the polarizer 26, the sample W and the analyzer 32 and reaches each pixel of the image sensor, light intensity (pixel brightness) L[i,j] at each pixel can be expressed by the following equation (7).

$$L[i,j] = \vec{s}^{T}M_{PSG}[i]M_{Wafer}M_{PSA}[j]\vec{d} \qquad \text{Equation (7)}$$

Here, $\vec{s}^{T}$ is a light source polarization vector, $M_{Wafer}$ is a Mueller matrix of the wafer surface, and $\vec{d}$ is a polarization sensitivity vector.

The light source polarization vector $\vec{s}^{\,T}$ may represent the Stokes parameter of the light that is emitted from the light source, passes through the illumination optical system and reaches just before the polarizer, and the polarization sensitivity vector $\vec{d}$ may represent the polarization sensitivity of the entire imaging optical system including the image sensor for the light that passes through the analyzer.

Substituting equations (5) and (6) into equation (7), it can be arranged as follows.

$$L[i,j] = \{\tau_{PSG}[i]\,\vec{s}^{\,T}\vec{p}\,(\theta_{PSG}[i])\} \cdot \{\vec{p}^{\,T}(\theta_{PSG}[i])$$
$$M_{Wafer}\vec{p}\,(\theta_{PSA}[j])\} = \eta_0 \cdot \alpha[i]K[i,j] \cdot \beta[j] \qquad \text{Equation (8)}$$

Here, where $\eta_0$ is an average brightness proportional constant, $\alpha[i]$ is the polarizer-side polarization transmittance of the, $\beta[j]$ is the analyzer-side polarization transmittance, and $K[i,j]$ is polarization transmittance of the wafer (sample) (kernel).

The polarizer-side polarization transmittance $\alpha[i]$ may be defined by Equation (9) below.

$$\alpha[i] = \tau_{PSG}[i]\,\vec{s}^{\,T}\vec{p}\,(\theta_{PSG}[i]) \qquad \text{Equation (9)}$$

The analyzer-side polarization transmittance $\beta[j]$ can be defined by Equation (10) below.

$$\beta[j] = \tau_{PSA}[j]\,\vec{p}^{\,T}(\theta_{PSA}[j])\,\vec{d} \qquad \text{Equation (10)}$$

The polarization transmittance $K[i,j]$ of the wafer may be defined by Equation (11) below.

$$K[i,j] = \vec{p}^{\,T}(\theta_{PSG}[i])M_{Wafer}\vec{p}\,(\theta_{PSA}[j]) \qquad \text{Equation (11)}$$

As the light emitted from the light source passes through various optical elements and finally reaches the image sensor, the light intensity $L[i,j]$ at each pixel of the image sensor may be obtained. The optical elements that transmit the light in the middle may affect the light intensity, and transmittance may vary according to a polarization state. That is, it can be seen that each optical element has polarization dependence.

As can be seen from Equation (8), the intensity $L[i,j]$ of the light that reaches each pixel of the two-dimensional image sensor may be expressed as the product of the polarizer-side polarization transmittance $\alpha[i]$, the analyzer-side polarization transmittance $\beta[j]$ and the polarization transmittance $K[i,j]$ of the sample. The polarizer-side polarization transmittance $\alpha[i]$ and the analyzer-side polarization transmittance $\beta[j]$ may correspond to the transmittance components for polarization of the optical equipment including the polarizer and the analyzer, and the polarization transmittance $K[i,j]$ of the sample may correspond to the transmittance component for polarization of the sample surface.

Since the light intensity value of each pixel includes the transmittance component for polarization of the polarizer and the analyzer, normalization of the light intensity may be performed to remove the polarization transmittance components of the polarizer and the analyzer from the light intensity value. to remove the polarization transmittance component of the polarizer and the analyzer from the light intensity value.

The normalized light intensity (normal pixel brightness) $Q[i,j]$ at each pixel may be defined as a value calculated by dividing the pixel brightness measured for all polarizer angles and all analyzer angles by the average polarizer-side pixel brightness and the analyzer-side pixel brightness average and can be expressed by Equation (12) below.

$$Q[i,j] = \frac{L[i,j]}{\langle L[i,j]\rangle_j[i] \cdot \langle L[i,j]\rangle_i[j]} \qquad \text{Equation (12)}$$

Here, $\langle L[i,j]\rangle_j[i]$ is the polarizer-side pixel average brightness (average brightness value for a specific polarizer angle (i-th)), and $\langle L[i,j]\rangle_i$ is the analyzer-side pixel average brightness (average brightness value for a specific analyzer angle (j-th)).

Equation (12) is rearranged as Equation (13) below.

$$\begin{aligned}
Q[i,j] &= \frac{\eta_0 \alpha[i]\beta[j]K[i,j]}{(\eta_0 \alpha[i]\langle\beta[j]K[i,j]\rangle_j[i]) \cdot (\eta_0 \beta[j]\langle\alpha[i]K[i,j]\rangle_i[j])} \\
&= \frac{1}{\eta_0} \cdot \frac{K[i,j]}{\langle\beta[j]K[i,j]\rangle_j[i] \cdot \langle\alpha[i]K[i,j]\rangle_i[j]} \\
&= \frac{1}{\eta_0 \eta_1 \eta_2} \frac{K[i,j]}{H_\alpha[i] \cdot H_\beta[j]}
\end{aligned} \qquad \text{Equation (13)}$$

Here, $H_\alpha[i]$ is a polarizer-side latent function, $H_\beta[j]$ is an analyzer-side latent function, and $\langle\ \rangle$ represents the average.

The polarizer-side latent function $H_\alpha[i]$ may be a sine wave expressed by two phases ($U_{PSG}$, $V_{PSG}$) as shown in Equation (14) below, and the analyzer-side latent function $H_\beta[j]$ may be a sine wave expressed by two constants ($U_{PSG}$, $V_{PSG}$) as shown in Equation (15) below.

$$H_\alpha[i] = \qquad \text{Equation (14)}$$
$$\frac{1}{\eta_1}\langle\beta[j]K[i,j]\rangle_j[i] = 1 + U_{PSG}\cos(\phi[i]) + V_{PSG}\sin(\phi[i])$$

$$H_\beta[j] = \qquad \text{Equation (15)}$$
$$\frac{1}{\eta_2}\langle\alpha[i]K[i,j]\rangle_i[j] = 1 + U_{PSA}\cos(\phi[j]) + V_{PSA}\sin(\phi[j])$$

The Mueller matrix of a silicon wafer (bare wafer) without a pattern formed therein or a wafer on which a single film is formed is known. The Mueller matrix $M_{NPW}$ of the silicon wafer can be expressed by Equation (16) below.

$$M_{NPW} = \frac{1}{1+D}\begin{bmatrix} 1+D & -N & 0 \\ -N & 1 & 0 \\ 0 & 0 & C \end{bmatrix} \qquad \text{Equation (16)}$$

The polarization transmittance $K_{NPW}[i,j]$ of the silicon wafer may be a two-dimensional sine wave expressed by five constants ($N$, $C$, $D$, $\Delta_{PSG}$, $\Delta_{PSA}$), and can be expressed by Equation (17) below.

$$\begin{aligned}
K_{NPW}[i,j] &= 1 - \frac{N}{1+D}(\cos(2\theta_{PSG}[i]) + \cos(2\theta_{PSA}[j])) + \\
&\quad \frac{1}{1+D}\cos(2\theta_{PSG}[i])\cos(2\theta_{PSA}[j]) + \\
&\quad \frac{C}{1+D}\sin(2\theta_{PSG}[i])\sin(2\theta_{PSA}[j])
\end{aligned} \qquad \text{Equation (17)}$$

As above, the normal pixel brightness $Q[i,j]$ may be a function expressed by a total of 9 constants, and each constant may be calculated by performing regression of the above function on the normal pixel brightness derived from the actual measurement data. The silicon wafer may be used as a reference sample, and the polarization transmittance K[i,j], the polarizer angle error $\Delta_{PSG}$ and the analyzer angle error $\Delta_{PSA}$ of the reference wafer are known.

The polarization transmittance component of the optical equipment, that is, the equipment polarization transmittance $\gamma[i,j]$ may be calculated from a value obtained by dividing the pixel brightness value L[i,j] measured using the silicon wafer whose the polarization transmittance value is known by the polarization transmittance K[i,j] of the silicon wafer calculated through the regression. The equipment polarization transmittance $\gamma[i,j]$ can be expressed as following equation (18).

$$\gamma[i,j]=\eta_0 \cdot \alpha[i] \neq \beta[j]=L[i,j]/K[i,j] \qquad \text{Equation (18)}$$

In addition, the polarizer-side polarization transmittance $\alpha[i]$ may be calculated from a value obtained by dividing the average value of the equipment polarization transmittance for a specific polarizer angle (i-th) by the overall average value of the equipment polarization transmittance. The polarizer-side polarization transmittance $\alpha[i]$ can be expressed by following equation (19).

$$\alpha[i]=\langle \gamma[i,j] \rangle_j/\langle \gamma[i,j] \rangle \qquad \text{Equation (19)}$$

The analyzer-side polarization transmittance $\beta[j]$ may be calculated from a value obtained by dividing the average value of the equipment polarization transmittance for a specific analyzer angle (j-th) by the overall average value of the equipment polarization transmittance. The analyzer-side polarization transmittance $\beta[j]$ can be expressed in following Equation (20).

$$\beta[j]=\langle \gamma[i,j] \rangle_{,[j]}/\langle \gamma[i,j] \rangle \qquad \text{Equation (20)}$$

In example embodiments, the first processor 52 may calculate the transmittance component $\gamma[i,j]$ for polarization of the optical equipment by using the light intensity L[i,j] for each pixel of the image obtained from the reference sample Wr at a set of angles including a first combination C1 of values of the first angle of the polarizer 26 and values of the second angle of the analyzer 32.

For example, a silicon wafer (bare wafer) on which a pattern is not formed may be used as a reference sample. Brightness images may be obtained at a set of angles including the first combination C1 of values of the polarizer angle and the analyzer angle with respect to the surface of the silicon wafer. In the first combination C1, the unit angle is 10°, the rotation index (i) of the polarizer 26 is t (t=0, 1, 2, . . . , 35), and the rotation index (j) of the analyzer 32 is t (t=0, 1, 2, . . . , 35). In this case, for each wavelength, 36×36 images may be obtained.

Figure 9A:
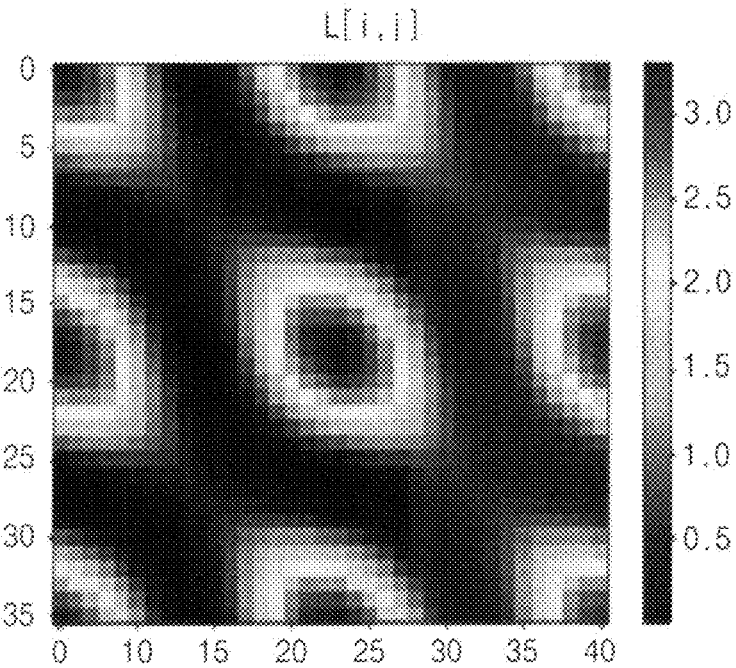
FIG. 9A is a view illustrating pixel brightness in one pixel of an image sensor obtained from a reference wafer at a first combination of a polarizer angle and an analyzer angle.
Figure 9B:
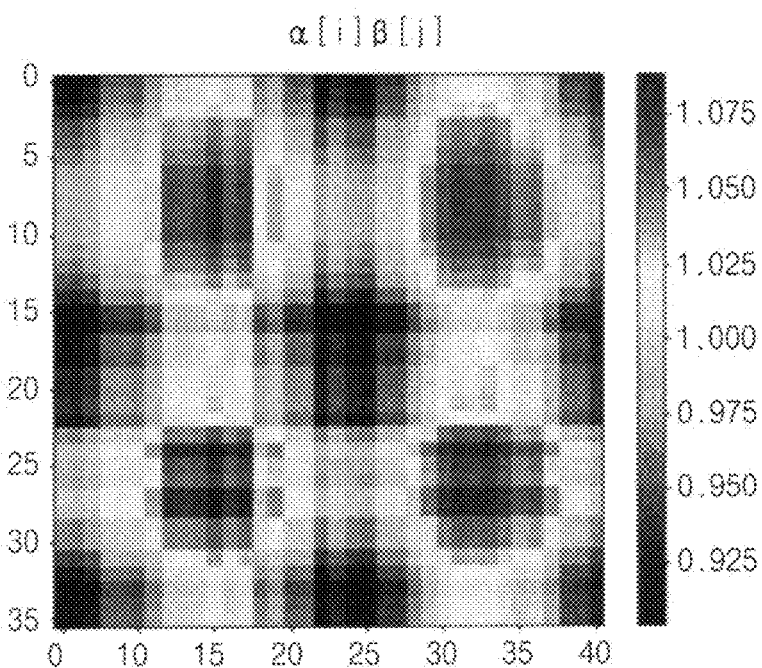
FIG. 9B is a view illustrating a product of polarizer-side polarization transmittance and analyzer-side polarization transmittance in one pixel obtained from the reference wafer of FIG. 9A.
Figure 9C:
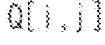
FIG. 9C is a view illustrating polarization transmittance of the reference wafer in one pixel obtained from the reference wafer of FIG. 9A.

FIG. 9A is a view illustrating pixel brightness L[i,j] in one pixel of an image sensor obtained from a reference wafer Wr at a first combination C1 of values of a polarizer angle and an analyzer angle, FIG. 9B is a view illustrating a product of the polarizer-side polarization transmittance $\alpha[i]$ and the analyzer-side polarization transmittance $\beta[j]$ in one pixel obtained from the reference wafer Wr of FIG. 9A, and FIG. 9C is a view illustrating the polarization transmittance K[i,j] of the reference wafer Wr in one pixel obtained from the reference wafer Wr of FIG. 9A. In each figure, X axis represents the rotation index (i) of the polarizer and Y axis represents the rotation index (j) of the analyzer.

Referring to FIGS. 9A to 9C, when light emitted from a light source passes through a polarizer 26, a sample W and an analyzer 32 at a specific angle combination to reach each pixel of the image sensor, the pixel brightness L[i,j] in each pixel may be expressed by the product of the transmittance component $\alpha[i] \cdot \beta[j]$ for polarization of the optical equipment (optical elements) including the polarizer 26 and the analyzer 32 and the transmittance component K[i,j] for polarization of the reference wafer surface.

Figure 10A:
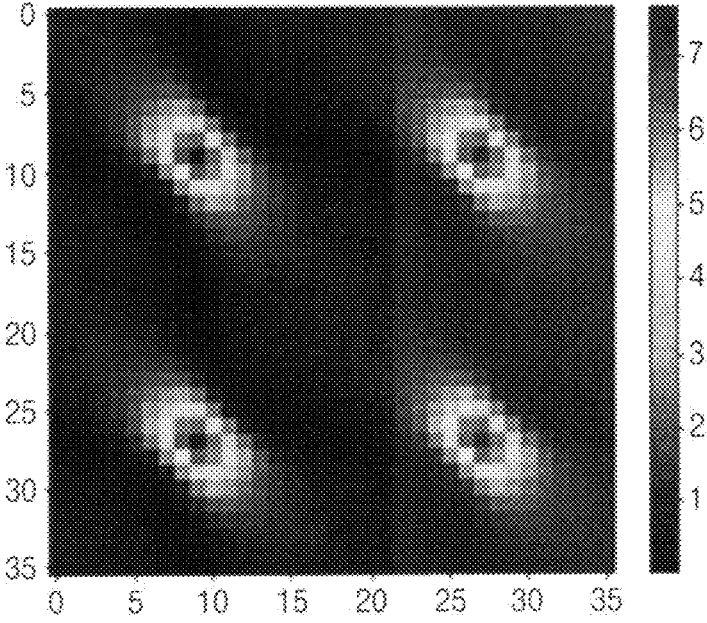
FIG. 10A is a view illustrating normal pixel brightness obtained by normalizing the pixel brightness of FIG. 9A.
Figure 10B:
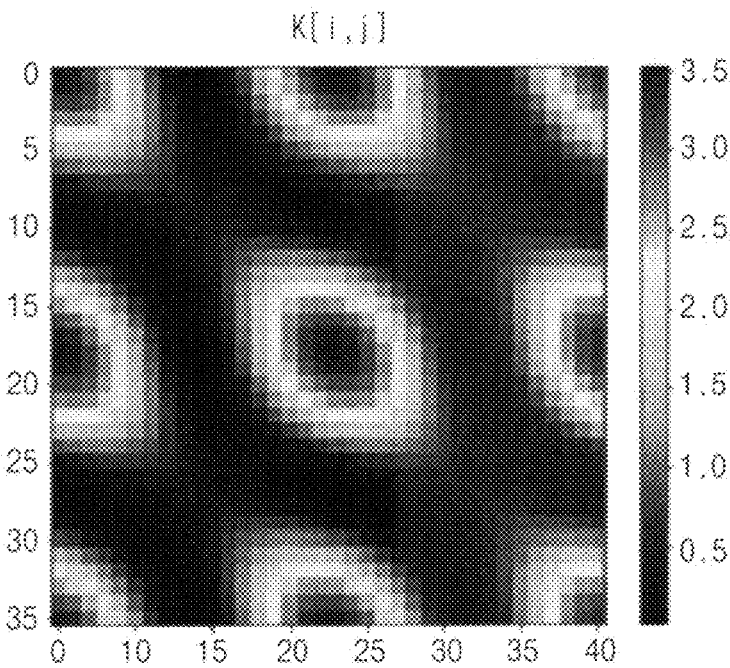
FIG. 10B is a view illustrating the polarization transmittance of FIG. 9C.
Figure 10C:
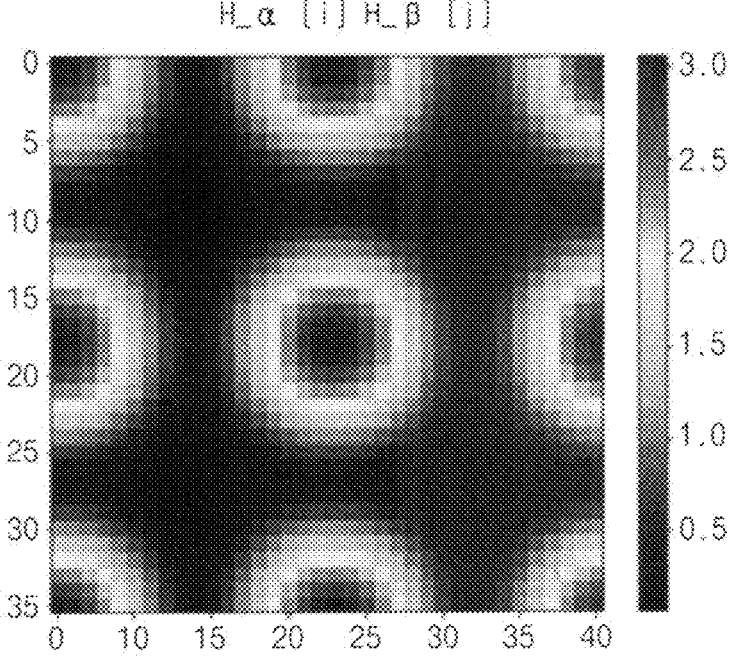
FIG. 10C is a view illustrating a product of a polarizer-side latent function and an analyzer-side latent function calculated in the normalization process of FIG. 10A.

FIG. 10A is a view illustrating the normal pixel brightness Q[i,j] obtained by normalizing the pixel brightness L[i,j] of FIG. 9A, FIG. 10B is a view illustrating the polarization transmittance K[i,j] of FIG. 9C, and FIG. 10C is a view illustrating the product of the polarizer-side latent function $H_\alpha[i]$ and the analyzer-side latent function $H_\beta[j]$ calculated in the normalization process of FIG. 10A. In each figure, X axis represents the rotation index (i) of the polarizer and Y axis represents the rotation index (j) of the analyzer.

Referring to FIGS. 10A to 10C, It can be seen that the normalized light intensity (normal pixel brightness) Q[i,j] at each pixel is a value obtained by dividing the transmittance component K[i,j] for polarization of the reference wafer surface by the polarizer-side latent function $H_\alpha[i]$ and the analyzer-side latent function $H_\beta[j]$.

The first processor 52 may derive the normal pixel brightness Q[i,j] from the pixel brightness value L[i,j] that is measured from the silicon wafer, may calculate the polarization transmittance K[i,j] of the silicon wafer through regression calculation of the known polarization transmittance function of the silicon wafer with respect to the derived normal pixel brightness, and may calculate the polarization transmittance component of the optical equipment, that is, equipment polarization degree $\gamma[i,j]$ from a value obtained by dividing the measured pixel brightness value L[i,j] by the calculated polarization transmittance K[i,j].

In example embodiments, the second processor 54 may generate and analyze at least a portion of the Muller matrix of the measurement target wafer W1 by using the light intensity L[i,j] in each pixel of the image obtained from the measurement target wafer at the set of angles including the second combination C2 of values of the first angle of the polarizer 26 and the second angle of the analyzer 32 and the polarization transmittance component of the optical equipment $\gamma[i,j]$ calculated by the first process 52, to measure an alignment error of the measurement target wafer W1.

For example, brightness images may be obtained at a set of angles including the second combination C2 of values of the polarizer angle and the analyzer angle with respect to the surface of the wafer on which a structure to be measured is formed, that is, the measurement target wafer W1. In the second combination C2, the unit angle is 10°, the rotation index (i) of the polarizer 26 is 5t (t=0, 1, 2, . . . , 35), and the rotation index (j) of the analyzer 32 is 3t (t=0, 1, 2, . . . , 35). In this case, for each wavelength, 36 images may be obtained.

Weighted polarization transmittance $\kappa[i,j]$ of the measurement target wafer W1 may be defined as the polarization transmittance of the wafer weighted by the average pixel brightness as shown in Equation (21) below.

$$\kappa[i, j] = \eta_0 K[i, j] = \frac{L[i, j]}{\alpha[i] \cdot \beta[j]} \qquad \text{Equation (21)}$$

The weighted polarization transmittance of the wafer may be calculated for all wavelengths and all pixels. A region of interest (ROI) may be set as a region in an image for which one overlay error value is to be measured, and thousands to tens of thousands of regions of interest (ROIs) may be set in the image as needed.

The average polarization transmittance of the region of interest ROI may be calculated by summing the weighted polarization transmittance values of pixels that belong to the region of interest ROI and then multiplying by a proportional constant so that the average value according to the polarization condition becomes 1.

In the second combination C2, the weighted polarization transmittance κ[5t,3t] of the wafer for each pixel may be expressed as Equation (22) below.

$$\kappa[5t, 3t] = \frac{L[5t, 3t]}{\alpha[5t]\beta[3t]} = \eta_4 K[5t, 3t] \qquad \text{Equation (22)}$$

The polarization transmittance $K_{ROI}[5t,3t]$ of the wafer in each region of interest ROI in the second combination C2 may be expressed by Equation (23) below.

$$K_{ROI}[5t, 3t] = \frac{\langle \kappa[5t, 3t] \rangle_{ROI}}{\langle\langle \kappa[5t, 3t] \rangle_{ROI} \rangle_t} \qquad \text{Equation (23)}$$

The polarization transmittance $K_{ROI}[5t,3t]$ of the wafer in each region of interest ROI may be expressed as Equation (24) below.

$K_{ROI}[5t,3t]=1+M_{21} \cos(\theta_{PSG}[5t])+M_{12} \cos(\theta_{PSA}[3t])+M_{31} \sin(\theta_{PSG}[5t])+M_{13} \sin(\theta_{PSA}[3t])+M_{22} \cos(\theta_{PSG}[5t])\cos(\theta_{PSA}[3t])+M_{33} \sin(\theta_{PSG}[5t])\sin(\theta_{PSA}[3t])+M_{32} \sin(\theta_{PSG}[5t])\cos(\theta_{PSA}[3t])+M_{23} \cos(\theta_{PSG}[5t])\sin(\theta_{PSA}[3t])$     Equation (24)

Due to the characteristic of the sine function, each elements of Mueller matrix can be calculated as in Equation (25) below.

$M_{11}$=1(Definition)

$M_{21}$=2$\langle K_{ROI}[5t,3t]\cos(\theta_{PSG}[5t]) \rangle_t$ $M_{31}$=2$\langle K_{ROI}[5t,3t]\sin(\theta_{PSG}[5t]) \rangle_t$ $M_{12}$=2$\langle K_{ROI}[5t,3t]\cos(\theta_{PSA}[3t]) \rangle_t$ $M_{13}$=2$\langle K_{ROI}[5t,3t]\sin(\theta_{PSA}[3t]) \rangle_t$ $M_{22}$=4$\langle K_{ROI}[5t,3t]\cos(\theta_{PSG}[5t])\cos(\theta_{PSA}[3t]) \rangle_t$ $M_{33}$=4$\langle K_{ROI}[5t,3t]\sin(\theta_{PSG}[5t])\sin(\theta_{PSA}[3t]) \rangle_t$ $M_{32}$=4$\langle K_{ROI}[5t,3t]\sin(\theta_{PSG}[5t])\cos(\theta_{PSA}[3t]) \rangle_t$ $M_{23}$=4$\langle K_{ROI}[5t,3t]\cos(\theta_{PSG}[5t])\sin(\theta_{PSA}[3t]) \rangle_t$    Equation (25)

In example embodiments, the second processor 54 may generate and analyze a 3×3 Mueller matrix for the region of interest (ROI) of the measurement target wafer W1 and calculate the alignment error of the measurement target wafer W1. Since the imaging ellipsometer uses two polarizing filters, namely, the polarizer 26 and the analyzer 32, interaction with the sample related to the circular polarization may not occur. Accordingly, the optical elements of the imaging ellipsometer 10 may be expressed as a 3×3 Mueller matrix.

The overlay error in the region of interest (ROI) may be evaluated by analyzing the off-diagonal components M13, M31, M23, M32 of the 3×3 Mueller matrix. The off-diagonal components may be cross-polarization elements sensitive to asymmetry.

As described above, the imaging ellipsometer 10 may include the light irradiator configured to irradiate the light having a polarization component to multiple points (a measurement area of a certain area) on the sample surface and the imaging assembly configured to receive the light reflected from the wafer and detect the image according to a polarization state at each of the plurality of points.

The light irradiator may include the monochromator configured to separate short wavelength band from broadband wavelength band and the polarizer configured to polarize the light incident on the measurement area, and the imaging assembly may include the analyzer configured to polarize the reflected light, the imaging mirror optical system being on the optical path of the reflected light that passes through the analyzer, and the two-dimensional image sensor as the light detector configured to receive the light passing through the imaging mirror optical system to collect data.

In addition, the image ellipsometer 10 may include the processor 50 configured to generate at least a portion of the Mueller matrix from the images obtained by the light detector 36 and analyze the elements of the at least a portion of the Mueller matrix to evaluate asymmetry such as an overlay error. The processor 50 may calculate the transmittance component γ[i,j] for polarization of the optical equipment by using the light intensity L[i,j] in each pixel of the image obtained from the reference wafer at a set of angles including the first combination C1 of values of the first angle of the polarizer 26 and the second angle of the analyzer 32. The second processor 54 may generate and analyze at least a portion of the Muller matrix of the measurement target wafer W1 by using the light intensity L[i,j] in each pixel of the image obtained from the measurement target wafer W1 at a set of angles including the second combination C2 of values of the first angle of the polarizer 26 and the second angle of the analyzer 32 and the polarization transmittance component of the optical equipment γ[i,j] calculated by the first process 52, to measure an alignment error of the measurement target wafer W1.

Accordingly, the imaging ellipsometer 10 may use a specific angle combination of two polarizing filters 26 and 32 to more accurately measure the alignment error by removing the influence of polarization distortion due to optical equipment such as an optical system except for the sample to be measured.

Further, the imaging mirror optical system may be a mirror-based imaging optical system including at least two mirrors. When the mirror-based imaging optical system is used, it may be possible to improve the transmittance of the optical system to improve the measurement sensitivity in short wavelength band and the measurement speed in broad wavelength band, and to minimize the focus deviation for each wavelength by reducing the occurrence of chromatic aberration.

Hereinafter, a method of measuring an alignment error of a measurement target wafer using the imaging ellipsometer will be described.

Figure 11:
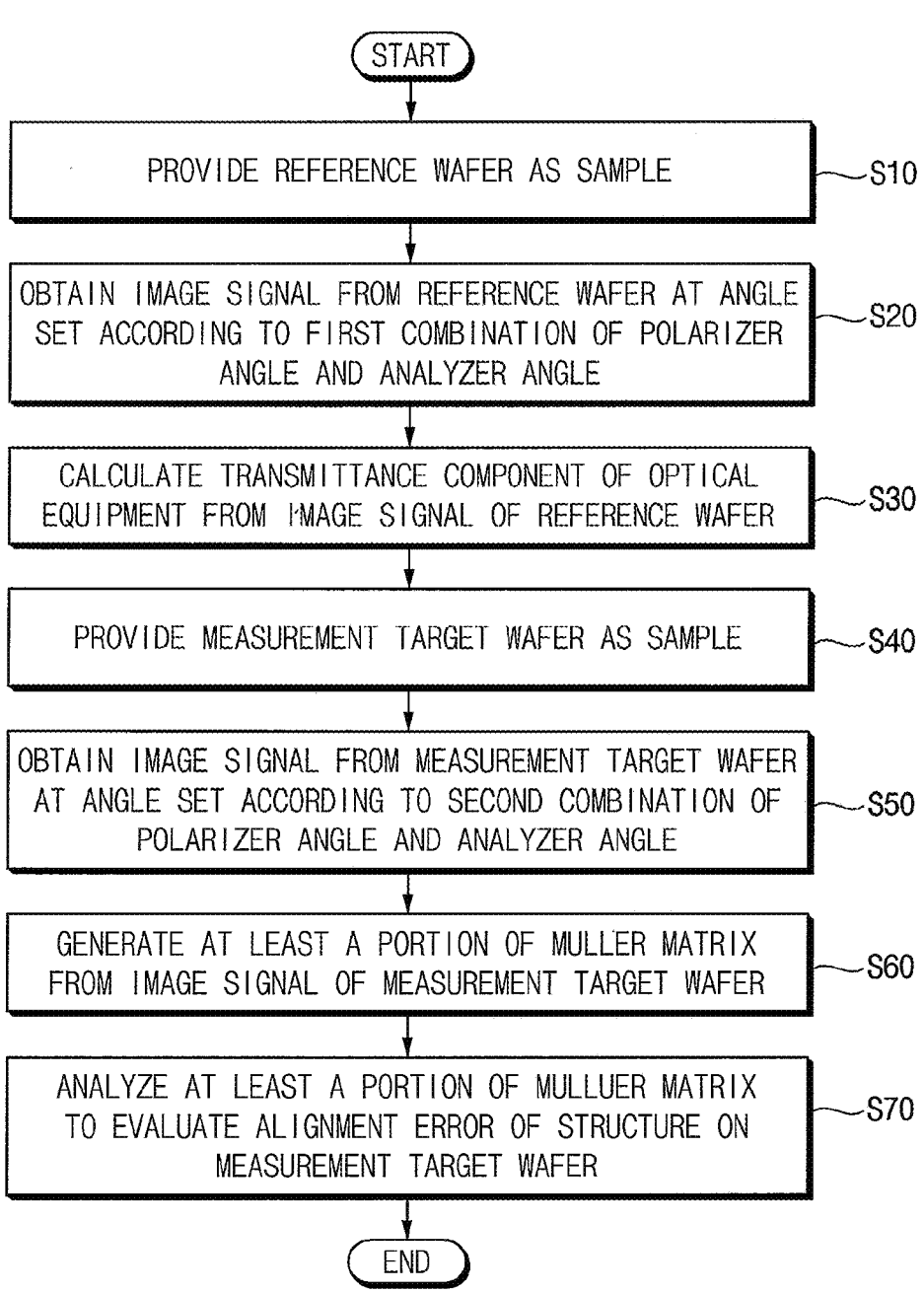

FIG. 11 is a flow chart illustrating a method of measuring an alignment error in accordance with example embodiments.

Referring to FIGS. 1 to 11, first, a reference wafer Wr may be provided as a sample (S10), and an image signal may be obtained from the reference wafer Wr at an angle including a first combination C1 of values of a polarizer angle and an analyzer angle (S20).

In example embodiments, the reference wafer Wr whose polarization transmittance on a surface is known may be placed on the stage 60. For example, a silicon wafer (bare wafer) on which a pattern is not formed may be used as the reference sample.

Brightness images may be obtained at an angle including the first combination C1 of values of the polarizer angle and the analyzer angle with respect to the surface of the reference wafer. In the first combination C1, the unit angle is 10°, the rotation index (i) of the polarizer 26 is t (t=0, 1, 2, . . . , 35), and the rotation index (j) of the analyzer 32 is t(t=0, 1, 2, . . . , 35). In this case, for each wavelength, 36×36 images may be obtained.

Then, transmittance component of the optical equipment may be calculated from the image signal of the reference wafer Wr (S30).

In example embodiments, light intensity of the light reaching each pixel of the two-dimensional image sensor may be expressed by a product of transmittance component for polarization of the optical equipment including the polarizer 26 and the analyzer 32 (optics factor) and transmittance component for polarization of the sample (reference wafer) surface (kernel).

As can be seen from equation (8), the pixel brightness L[i,j] in each pixel may be expressed by the product of the transmittance component $\alpha[i]\cdot\beta[j]$ for polarization of the optical equipment (optical elements) including the polarizer 26 and the transmittance component K[i,j] for polarization of the reference wafer surface.

The normal pixel brightness Q[i,j] may be derived from the measurement data of the reference wafer. As described above, the normal pixel brightness Q[i,j] may be a function expressed by a total of 9 constants, and each of the constants may be obtained by performing regression of the above function on the derived normal pixel brightness. Accordingly, it may be possible to calculate the polarization transmittance K[i,j] of the reference wafer.

Since the polarization transmittance value of the reference wafer is known, as in Equation (18), the polarization transmittance component of the optical equipment, that is, the equipment polarization transmittance $\gamma[i,j]$ may be calculated from a value obtained by dividing the measured pixel brightness value L[i,j] by the polarization transmittance K[i,j] of the reference wafer calculated through the regression.

Then, a measurement target wafer W1 may be provided as a sample (S40), and an image signal may be obtained from the measurement target wafer W1 at an angle or angle set of values including a second combination C2 of values of the polarizer angle and the analyzer angle (S50).

In example embodiments, the measurement target wafer W1 having a structure to be measured on a surface thereof may be on the stage 60. For example, the measurement target wafer W1 may include a die (chip) area DA in which circuit patterns and cells are formed and a scribe lane area SA surrounding the die area DA. A measurement area 70 to which the incident light Li is incident may be in the die area DA of the measurement target wafer W1. Accordingly, it may be possible to measure an overlay in the cell region (On-Cell Overlay) of the actual chip.

A region of interest (ROI) may be set in the pixel array 36 of the camera. One region of interest (ROI) may be formed by gathering several pixels. The number of pixels in one region of interest (ROI) may be set in consideration of the size of a unit device in the cell region. As will be described later, one overlay error value may be calculated from one ROI. For example, thousands to tens of thousands of ROIs may be set in one image.

The measurement target wafer W1 may include a lower pattern 72 and an upper pattern 74 vertically stacked on the lower pattern 72 in the region of interest ROI (FIG. 5). Each of the lower pattern 72 and the upper pattern 74 may include a grid shape extending in one direction, an isolated shape of a dot shape, etc. At least one of the lower pattern 72 and the upper pattern 74 may have a through-hole shape with high aspect ratio.

Brightness images may be obtained at an angle or set of angles including the second combination C2 of values of the polarizer angle and the analyzer angle with respect to the surface of the measurement target wafer W1. In the second combination C2, the unit angle is the rotation index (i) of the polarizer 26 is 5t (t=0, 1, 2, . . . , 35), and the rotation index (j) of the analyzer 32 is 3t (t=0, 1, 2, . . . , 35). In this case, for each wavelength, 36 images may be obtained.

Then, at least a portion of the Mueller matrix may be generated from the image signal of the measurement target wafer W1 (S60), and an alignment error of the structure on the measurement target wafer W1 may be evaluated by analyzing the at least a portion of the Mueller matrix (S70).

In example embodiments, weighted polarization transmittance $\kappa[i,j]$ of the measurement target wafer W1 may be calculated. The weighted polarization transmittance of the wafer may be calculated for all wavelengths and all pixels. Average polarization transmittance of the region of interest ROI may be calculated by summing the weighted polarization transmittance values of pixels that belong to the region of interest ROI and then multiplying by a proportional constant so that the average value according to the polarization condition becomes 1.

The weighted polarization transmittance $\kappa[5t,3t]$ of the wafer for each pixel in the second combination C2 and the polarization transmittance $K_{ROI}[5t,3t]$ of the wafer in each region of interest ROI in the second combination C2 may calculated. Each elements of a Mueller matrix may be calculated from the polarization transmittance $K_{ROI}[5t,3t]$ of the wafer in each region of interest ROI In example embodiments, a 3×3 Mueller matrix for the region of interest (ROI) of the measurement target wafer W1 may be generated and analyzed to measure an alignment error of the measurement target wafer W1. An overlay error in the region of interest (ROI) may be evaluated by analyzing off-diagonal components M13, M31, M23, M32 of the 3×3 Mueller matrix. The off-diagonal components may be cross-polarization elements sensitive to asymmetry.

The above-described imaging ellipsometer may be used to manufacture a semiconductor device such as a logic device or a memory device. The semiconductor device may include logic devices, e.g., central processing units (CPUs), main processing units (MPUs), or application processors (APs), or the like, and volatile memory devices, e.g., dynamic random access memory (DRAM) devices, high bandwidth memory (HBM) devices, or non-volatile memory devices, e.g., flash memory devices, phase change random access memory (PRAM) devices, magnetic random access memory (MRAM) devices, resistive random access memory (Re-RAM) devices, or the like.

The foregoing is illustrative of example embodiments and is not to be construed as limiting thereof. Although example embodiments have been described, those skilled in the art will readily appreciate that many modifications are possible in example embodiments without materially departing from the teachings of the present application. Accordingly, all such modifications are intended to be included within the scope of example embodiments as defined in the claims.

What is claimed is:

1. A method of measuring an alignment error, the method comprising:

irradiating incident light on a surface of a reference wafer having a known polarization transmittance at the surface;

obtaining an image signal from the reference wafer at a set of angles including a first combination of values of a polarizer angle and an analyzer angle;

calculating polarization transmittance of optical equipment including a polarizer and an analyzer from the image signal of the reference wafer;

irradiating incident light on a surface of a measurement target wafer having a structure thereon;

obtaining an image signal from the measurement target wafer at a set of angles including a second combination of values of the polarizer angle and the analyzer angle; and generating at least a portion of a Mueller matrix from the image signal of the measurement target wafer and the polarization transmittance of optical equipment including the polarizer and the analyzer.

2. The method of claim 1, wherein obtaining the image signal from the reference wafer at the set of angles including the first combination of values of the polarizer angle and the analyzer angle includes:

for each angle in the set of angles:

rotating the polarizer that is on an optical path of the incident light to be incident on the reference wafer surface by a first angle; and rotating an analyzer that is on an optical path of reflected light reflected from the reference wafer surface by a second angle.

3. The method of claim 1, wherein a measurement area of the light incident on the surface of the measurement target wafer is located within a die region.

4. The method of claim 1, wherein a measurable spot size of the light incident on the surface of the measurement target wafer has an area of at least 20 mm×20 mm.

5. The method of claim 1, wherein the structure on the surface of the measurement target wafer includes a lower pattern and an upper pattern stacked on the lower pattern.

6. The method of claim 1, wherein calculating the polarization transmittance of the optical equipment includes:

expressing pixel brightness in each pixel as a product of the polarization transmittance of the optical equipment including the polarizer and the analyzer and polarization transmittance of the reference wafer surface;

performing normalization on the pixel brightness to calculate normal pixel brightness;

performing regression of a function of the normal pixel brightness through the known polarization transmittance of the reference wafer surface to calculate the polarization transmittance of the reference wafer; and calculating the transmittance of the optical equipment from a value obtained by dividing the pixel brightness by the calculated polarization transmittance of the reference wafer.

7. The method of claim 6, wherein the pixel brightness is expressed by an equation $$L[i,j] = \eta_0 \cdot \alpha[i] \cdot K[i,j] \cdot \beta[j]$$

where $L[i, j]$ is the pixel brightness, $\eta_0$ is an average brightness proportional constant, $\alpha[i]$ is polarizer-side polarization transmittance, $\beta[j]$ is analyzer-side polarization transmittance, and $K[i, j]$ is the polarization transmittance of the wafer.

8. The method of claim 1, further comprising:

analyzing the at least a portion of the Mueller matrix to evaluate an alignment error of the structure on the measurement target wafer.

9. The method of claim 1, wherein generating the at least a portion of the Mueller matrix from the image signal of the measurement target wafer includes, calculating the polarization transmittance of the measurement target wafer by subtracting the polarization transmittance of the optical equipment from a pixel brightness in each pixel; and calculating the at least a portion of the Mueller matrix from the calculated polarization transmittance.

10. The method of claim 9, wherein calculating the polarization transmittance of the measurement target wafer further include calculating the polarization transmittance of the measurement target wafer in a region of interest.

11. A method of measuring an alignment error, the method comprising:

positioning a polarizer on an optical path of incident light to be incident on a sample surface, the polarizer being rotatable by a first angle to adjusting a polarization direction of the incident light;

positioning an analyzer on an optical path of light reflected from the sample surface, the analyzer being rotatable by a second angle to adjust a polarization direction of the reflected light;

providing a reference wafer having a known polarization transmittance at a surface as a sample;

obtaining an image signal from the reference wafer at set of angles including a first combination of the first angle of the polarizer and the second angle of the analyzer;

calculating polarization transmittance of optical equipment including the polarizer and the analyzer from the image signal of the reference wafer;

providing a measurement target wafer having a structure to be measured on a surface thereof as the sample;

obtaining an image signal from the measurement target wafer at a set of angles including a second combination of the first angle of the polarizer and the second angle of the analyzer; and generating at least a portion of a Mueller matrix from the image signal of the measurement target wafer and the polarization transmittance of optical equipment including the polarizer and the analyzer.

12. The method of claim 11, wherein a measurement area of the light incident on the surface of the measurement target wafer is located within a die region.

13. The method of claim 11, wherein a measurable spot size of the light incident on the surface of the measurement target wafer has an area of at least 20 mm×20 mm.

14. The method of claim 11, wherein calculating the transmittance of the optical equipment includes, expressing pixel brightness in each pixel as a product of the polarization transmittance of the optical equipment including the polarizer and the analyzer and polarization transmittance of the reference wafer surface;

performing normalization on the pixel brightness to calculate normal pixel brightness;

performing regression of a function of the normal pixel brightness through the known polarization transmittance of the reference wafer surface to calculate the polarization transmittance of the reference wafer; and calculating the transmittance of the optical equipment from a value obtained by dividing the pixel brightness by the calculated polarization transmittance of the reference wafer.

15. The method of claim 11, wherein the structure on the measurement target wafer includes a lower pattern and an upper pattern stacked on the lower pattern.

16. The method of claim 11, further comprising:

analyzing the at least a portion of the Mueller matrix to evaluate an alignment error of the structure on the measurement target wafer.

17. The method of claim 16, wherein analyzing the at least a portion of the Mueller matrix includes analyzing off-diagonal components 3×3 Mueller matrix.

18. The method of claim 11, further comprising:

positioning an imaging mirror optical system on an optical path of the reflected light that passes through the analyzer; and receiving the light that passes through the imaging mirror optical system to obtain an image signal from the sample.

19. The method of claim 11, wherein generating the at least a portion of the Mueller matrix from the image signal of the measurement target wafer includes, calculating the polarization transmittance of the measurement target wafer by subtracting the polarization transmittance of the optical equipment from pixel brightness in each pixel; and calculating the at least a portion of the Mueller matrix from the calculated polarization transmittance.

20. The method of claim 19, wherein calculating the polarization transmittance of the measurement target wafer further include calculating the polarization transmittance of the measurement target wafer in a region of interest.

\* \* \* \* \*